United States Patent
Serizawa (10) Patent No.: US 7,460,627 B2
(45) Date of Patent: Dec. 2, 2008

(54) DATA REPRODUCTION DEVICE

(75) Inventor: Orimitsu Serizawa, Gyouda (JP)

(73) Assignee: Sanyo Electric Co., Ltd., Moriguchi-shi, Osaka (JP)

( * ) Notice: Subject to any disclaimer, the term of this patent is extended or adjusted under 35 U.S.C. 154(b) by 609 days.

(21) Appl. No.: 10/978,291

(22) Filed: Oct. 29, 2004

(65) Prior Publication Data

US 2005/0117489 A1 Jun. 2, 2005

(30) Foreign Application Priority Data

Oct. 31, 2003 (JP) ............................. 2003-373520

(51) Int. Cl.
*H04B 1/10* (2006.01)
(52) U.S. Cl. .................. 375/350; 375/229; 375/230; 375/232; 369/59.16; 369/59.22
(58) Field of Classification Search ................ 375/350, 375/232, 229, 230; 386/113, 114; 369/59.22, 369/59.16
See application file for complete search history.

(56) References Cited

U.S. PATENT DOCUMENTS

| | | | | |
|---|---|---|---|---|
| 4,489,353 A | * | 12/1984 | Inami et al. | 360/25 |
| 4,785,411 A | * | 11/1988 | Thompson et al. | 708/322 |
| 5,121,364 A | * | 6/1992 | O'Donnell | 367/98 |
| 5,252,905 A | * | 10/1993 | Wills et al. | 318/807 |
| 5,682,125 A | | 10/1997 | Minuhin et al. | |
| 5,854,717 A | | 12/1998 | Minuhin | |
| 6,385,239 B1 | * | 5/2002 | Okamoto et al. | 375/232 |
| 6,671,244 B2 | * | 12/2003 | Honma | 369/59.22 |
| 2001/0009608 A1 | * | 7/2001 | Tanaka et al. | 386/113 |
| 2004/0114912 A1 | * | 6/2004 | Okamoto et al. | 386/114 |

FOREIGN PATENT DOCUMENTS

| | | |
|---|---|---|
| JP | 5128729 | 5/1993 |
| JP | 9-198799 | 7/1997 |
| JP | 9185871 | 7/1997 |
| JP | 2000-200462 | 7/2000 |
| JP | 2001-209902 | 8/2001 |

OTHER PUBLICATIONS

English Patent Abstract of 2001-209902 from esp@cenet.
Notice of Grounds for Rejection issued in Japanese Patent Application No. 2003-373520 dated Jan. 15, 2008 and the English translation (4 pages).
Japanese Office Action for Japanese Application No. 2003-373520, mailed on Apr. 1, 2008 with partial English translation (3 pages).
esp@cenet patent abstract for Japanese Publication No. 2000200462, Publication date Jul. 18, 2000 (1 page).
esp@cenet patent abstract for Japanese Publication No. 9198799, Publication date Jul. 31, 1997 (1 page).

\* cited by examiner

*Primary Examiner*—Mohammad H Ghayour
*Assistant Examiner*—Leila Malek
(74) *Attorney, Agent, or Firm*—Osha•Liang LLP (57) ABSTRACT

A data reproduction device for equalizing a reproduced digital signal. A signal reproduced using a reproduction head is sequentially processed by an analogue filter, an A/D, and an interpolator before being supplied to a digital equalizer. The digital equalizer digitally equalizes an input digital signal to output to a subsequent Viterbi decoder, or the like. The digital equalizer comprises a variable BPF, and a variable FIR filter, and the filtering characteristic is variably adjusted.

7 Claims, 11 Drawing Sheets

PRIOR ART

DATA REPRODUCTION DEVICE

CROSS-REFERENCE TO RELATED APPLICATIONS

The disclosure of Japanese Patent Application No.2003-373520 including specification, claims, drawings, and abstract is incorporated herein by reference in its entirety.

BACKGROUND OF THE INVENTION

1. Field of the Invention

The present invention relates to a data reproduction device, and in particular to equalization of a digital data reproduction signal.

2. Description of the Related Art

There is known a technique for reproducing digital image and speech signals recorded on a magnetic tape or the like. A device employing this technique equalizes a reproduced signal using an equalizer so that deterioration of the signal as it passes through the recording and reproduction system, or variation among magnetic tapes, tape types, or magnetic heads are compensated for so that errors can be reduced.

Figure 14:
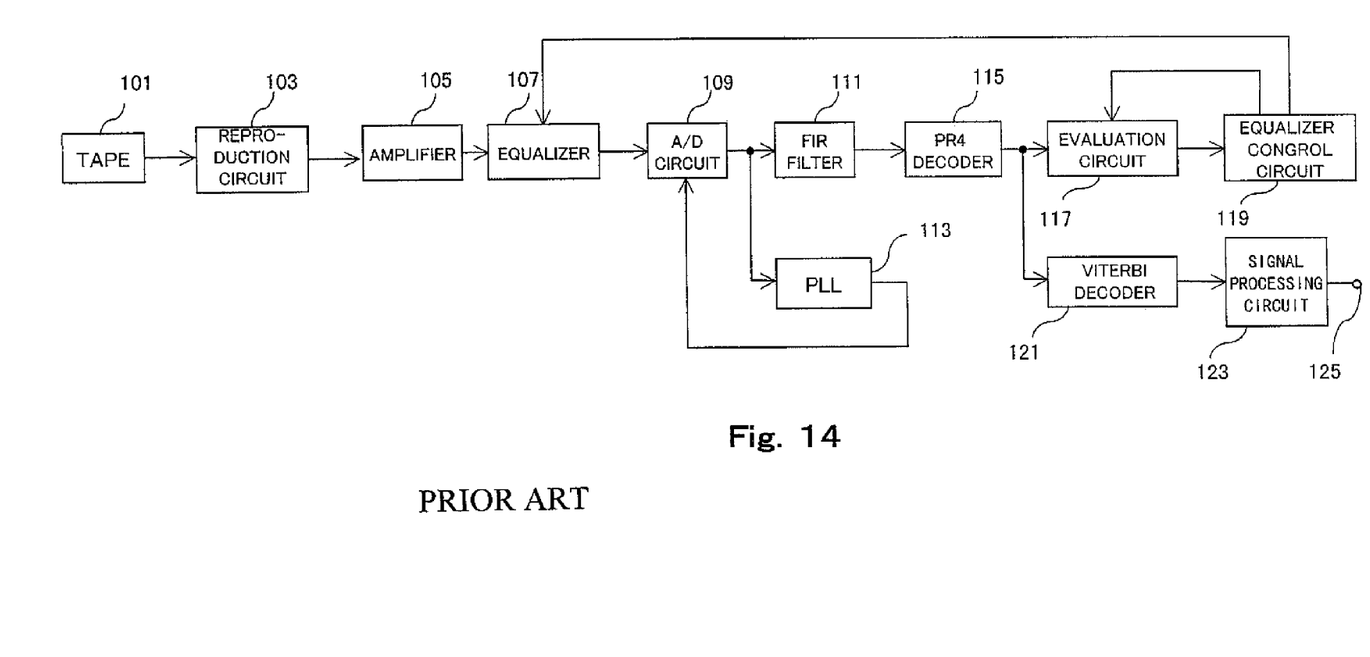
FIG. 14 is a diagram showing a structure of a conventional device.

FIG. 14 is a block diagram showing a structure of a conventional reproduction device having an equalizer. A reproduction circuit 103 comprises a rotating magnetic head and reproduces information, such as an image signal, a speech signal, and a sub-code, which are recorded on a track of a magnetic tape 101, to output as an analogue signal. An amplifier 105 amplifies the reproduced signal sent from the rotating head before outputting to an equalizer 107.

The equalizer 107 comprises a high region enhancement filter, an all-pass filter for adjusting a group delay in a low region (that is, a low region group delay), and an all-pass filter for adjusting a group delay in a high region (that is, a high region group delay). The high region enhancement filter compensates for deterioration of a high region component of a signal sent from the amplifier 105 before outputting to the low region group delay adjustment all-pass filter. The low region group delay adjustment all-pass filter adjusts a group delay in a low region of the analogue reproduced signal so that dipulse characteristic of the magnetic tape can be compensated for, before output to the high region group delay adjustment all-pass filter. The high region group delay adjustment all-pass filter adjusts a group delay in the high region of the analogue reproduced signal, and then applies integration to the signal before outputting to an A/D 109.

The A/D 109 converts the analogue reproduced signal sent from the equalizer 107 into a digital signal before outputting to an FIR (Finite Impulse Response) filter 111 and a PLL 113. In the above, the A/D 109 samples the analogue reproduced signal in response to a clock supplied from the PLL 113.

The FIR filter 111 comprises a plurality of latches and coefficient units, and adjusts group delay characteristic of a signal before output to a PR4 decoder 115. The PR4 decoder 115 demodulates a digital signal subjected to PR4 pre-coding before outputting to an evaluation circuit 117 and a Viterbi decoder 121. The evaluation circuit 117 evaluates the characteristic of the equalizer 107, and outputs the evaluation result to an equalizer control circuit 119 to adjust the characteristic of the equalizer 107.

The Viterbi decoder 121 detects a digital signal of one-sample-one-bit out of the output from the PR4 decoder 115 according to the Viterbi algorithm before outputting to a signal processing circuit 123. The signal processing circuit 123 obtains an reproduced image signal and a reproduced speech signal based on the digital signal obtained by the Viterbi decoder 121 to output via an output terminal 125.

Japanese Patent Laid-open Publication No. 20001-209902 discloses the above-described data reproduction device.

In the above, variation can be accommodated to some extent when an analogue reproduced signal obtained by the reproduction circuit 103 is equalized by the equalizer 107. However, there exist the limits in improving the error reduction capability and/or characteristic variation accommodating capability. In particular, as a variety of magnetic tapes and heads have recently become available and, accordingly, characteristic variation become more diversified, demands arise for cost reduction, more stabilized performance, and user demand respondable flexibility. Particularly, an equalizer having variably, flexibly, and accurately adjustable equalizing characteristic is desired.

SUMMARY OF THE INVENTION

The present invention provides a data reproduction device for more flexibly and accurately equalizing a reproduced signal so that a reproduction error can be reduced.

According to the present invention, there is provided a device for reproducing data, comprising reproduction means for reproducing digital data; analogue-digital conversion means for converting an analogue signal sent from the reproduction means to a digital signal; and digital equalizing means for equalizing the digital signal sent from the analogue-digital conversion means so as to have desired target characteristic, wherein the digital equalizing means has variable filtering means for adjusting an amplitude of the digital signal sent from the analogue-digital conversion means, variable group delay filtering means for adjusting a group delay of the digital signal sent from the variable filtering means, and variable FIR filtering means for compensating for a difference between characteristic of the digital signal sent from the variable group delay filtering means and the target characteristic.

According to the present invention, digital data recorded on a recording medium such as a magnetic tape is reproduced as an analogue signal; the analogue signal is converted into a digital signal by an analogue-digital conversion means (A/D), instead of being equalized by an equalizer; and the digital signal is equalized by the equalizing means (digital equalizing means).

The digital equalizing means comprises filtering means for adjusting the amplitude of the digital signal (amplitude characteristics relative to frequency), filtering means for adjusting a group delay of the digital signal (group delay characteristics relative to frequency), and filtering means for compensating for a difference (or an error) between the characteristic of the digital signal having been filtered by these filtering means and the target characteristic. These filtering means are variable filtering means having adjustable filtering characteristics. This arrangement enables flexible and highly accurate equalization according to the characteristics of the recording medium in use such as a magnetic tape and/or characteristics variation of recording heads.

In one embodiment of the present invention, the variable filtering means may comprise variable band-pass filtering means for adjusting the amplitude of the digital signal sent from the digital-analogue conversion means, and variable high-pass filtering means for further adjusting the amplitude of the digital signal from the variable band-pass filtering means. The variable band-pass filtering means passes, with priority, a predetermined frequency band of the digital signal relative to the rest to adjust amplitude characteristic, and the variable high-pass filter passes, with priority, a high region of the digital signal relative to the rest to adjust amplitude characteristic.

In another embodiment of the present invention, the device may further comprise an interpolator for interpolating the digital signal sent from the analogue-digital conversion means and re-sampling the digital signal interpolated to output a resultant digital signal to the digital equalizing means. The interpolator performs interpolation relative to the digital signal having been asynchronously sampled, and re-samples the interpolated digital signal at the original sampling timing. The re-sampled digital signal is equalized by the digital equalizing means.

In still another embodiment of the present invention the variable filtering means may comprise fixed FIR filtering means for adjusting a high region amplitude of the digital signal sent from the digital-analogue conversion means, variable band-pass filtering means for adjusting a predetermined band amplitude of the digital signal sent from the fixed FIR filtering means, and variable high-pass filtering means for adjusting the high region amplitude of the digital signal sent from the variable band-pass filtering means.

In the present invention, any method may be used to change the coefficients of the various filtering means. One example of such a method may be such that a user writes a coefficient data value to a register so that the register sends the coefficient data value to each filtering means.

The present invention will be more clearly understood from the following description of an embodiment of the present invention. However, the scope of the present invention is not limited to the embodiment in any way.

BRIEF DESCRIPTION OF THE DRAWINGS

A preferred embodiment of the present invention will be described in detail based on the following figures, wherein.

DESCRIPTION OF THE PREFERRED EMBODIMENT

In the following, an embodiment of the present invention will be described.

Figure 1:
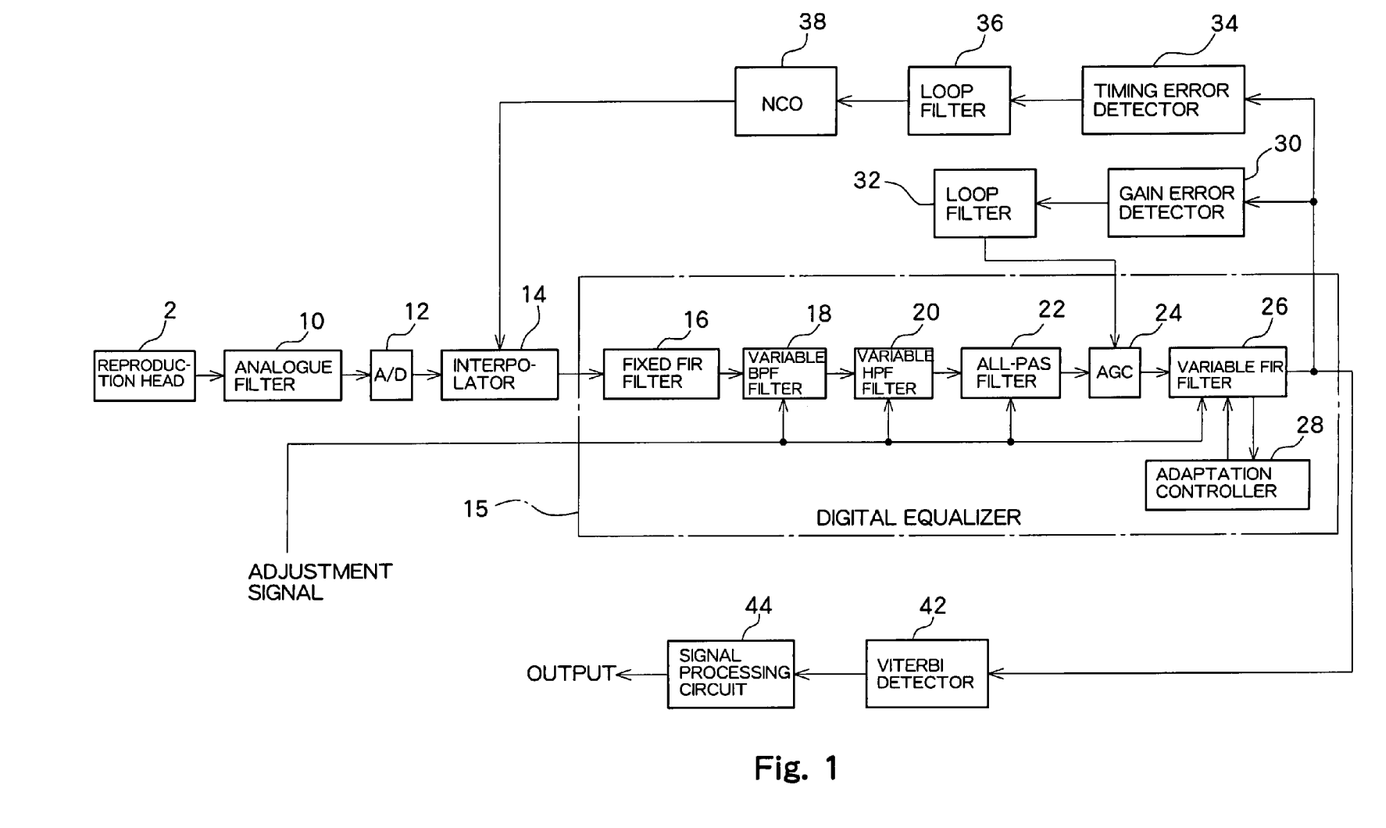
FIG. 1 is a diagram showing the entire structure of an embodiment of the present invention.

FIG. 1 is a block diagram showing a structure of a data reproduction device according to this embodiment. A reproduction head 2 reproduces digital data recorded on a magnetic tape, or the like, and amplifies the result using an amplifier before outputting the signal to an analogue filter 10.

Figure 2:
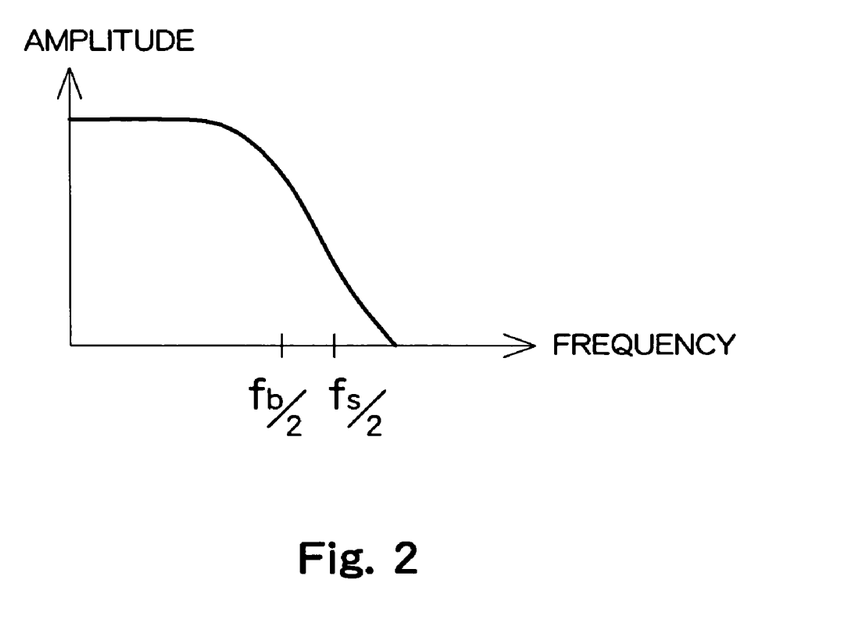
FIG. 2 is a diagram for explaining characteristic of the analogue filter shown in FIG. 1.

The analogue filter 10 comprises an anti-aliasing filter for cutting a frequency component equal to or larger than fb/2 (fb: bit rate) of an analogue signal to output. The analogue filter 10 has a filtering characteristic shown in FIG. 2, in which the abscissa corresponds to frequencies, the ordinate corresponds to amplitudes, and fs represents a sample frequency.

An A/D 12 converts the analogue signal from the analogue filter 10 into a digital signal before outputting to an interpolator 14. Specifically, the A/D 12 samples the analogue signal in response to a clock from a PLL (not shown) and quantizes the sampled signal with one-sample-a plurality of bits before digitization.

The interpolator 14 estimates data on a symbol between sampling points. This symbol data interpolation by the interpolator 14 is necessary because data sampling by the A/D 12 is performed in response to a clock from the PLL, that is, at a timing asynchronous with a symbol (asynchronous sampling). Thereafter, the interpolator 14 re-samples the interpolated data.

Figure 3:
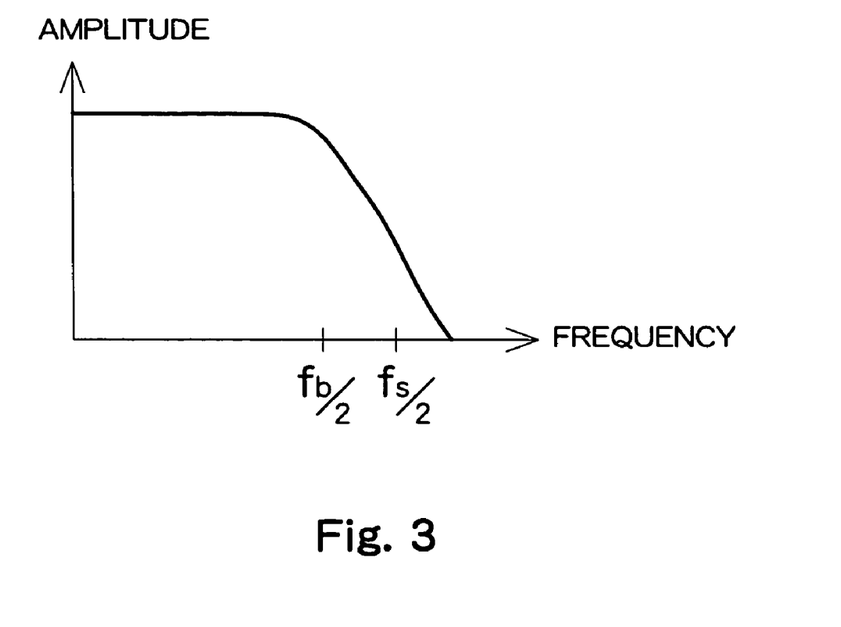
FIG. 3 is a diagram for explaining characteristic of the interpolator shown in FIG. 1.
Figure 4:
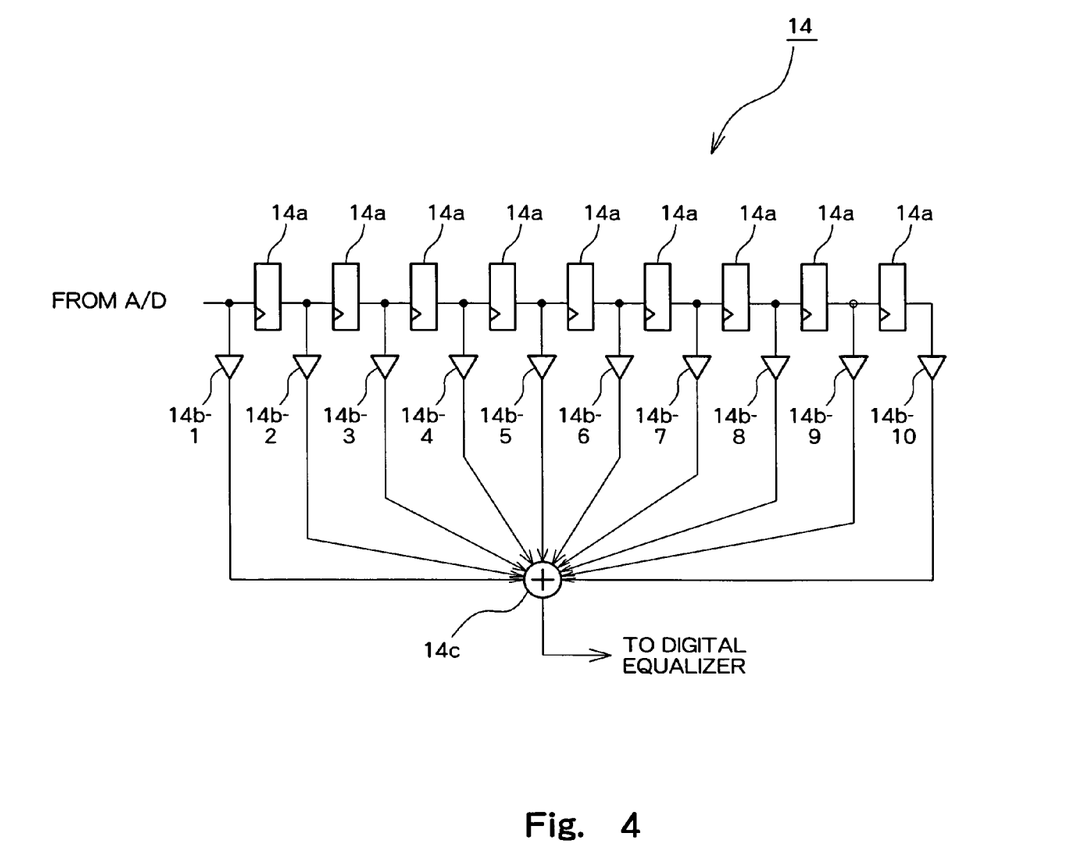
FIG. 4 is a diagram showing a structure of the interpolation shown in FIG. 1.

The interpolator 14 basically comprises an FIR filter. The characteristics of the filter is shown in FIG. 3. FIG. 4 shows a structure of the interpolator 4. As shown, the interpolator 14 comprises a plurality of (nine in the drawing) serially connected latches 14$a$, a plurality of (ten in the drawing) parallel connected coefficient units 14$b$-1 to 14$b$-10, and an adder 14$c$. Each latch 14$a$ holds a digital signal during a sampling period before outputting. Each of the coefficient units 14$b$-1 to 14$b$-10 multiplies an input digital signal by a predetermined coefficient and outputs the result to the adder 14$c$. The adder 14$c$ adds the outputs from the respective coefficient units 14$b$-1 to 14$b$-10 and outputs the result to the subsequent digital equalizer.

The respective coefficient units 14$b$-1 to 14$b$-10 are set in advance with respective coefficients, examples of which are shown below:

coefficient units 14$b$-1, 2: coefficient=0
coefficient unit 14$b$-3: coefficient=0.1
coefficient unit 14$b$-4: coefficient=−0.5
coefficient unit 14$b$-5: coefficient=−0.8
coefficient unit 14$b$-6: coefficient=0.2
coefficient unit 14$b$-7: coefficient=0.1
coefficient unit 14$b$-8: coefficient=−0.3
coefficient units 14$b$-9, 10: coefficient=0

It is preferable that a plurality of coefficient sets (for example, 32 sets) are prepared in advance so that any desirable set can be selected thereafter. That is, any coefficient set which is suitable for the position for interpolation is selected for use from among the plurality of sets. A position for interpolation, that is, an interpolation timing, is adjusted using a timing control circuit, which comprises a timing error detector 34, a loop filter 36, an NCO (Numerically Control Oscillator) 38.

The digital signal having been interpolated and resampled by the interpolator 14 is supplied to a digital equalizer 15 for equalization.

The digital equalizer 15 adjusts the amplitude and group delay of the digital signal such that the characteristic of the digital signal is modified so as to coincide with the target characteristic. Specifically, the digital equalizer 15 equalizes a digital signal in this embodiment. The digital equalizer 15 comprises a fixed FIR filter 16, a variable band-pass filter (a variable BPF) 18, a variable high-pass filter (a variable HPF) 20, an all-pass filter 22, an auto gain controller (AGC) 24, a variable FIR filter 26, and an adaptation controller 28.

Figure 5:
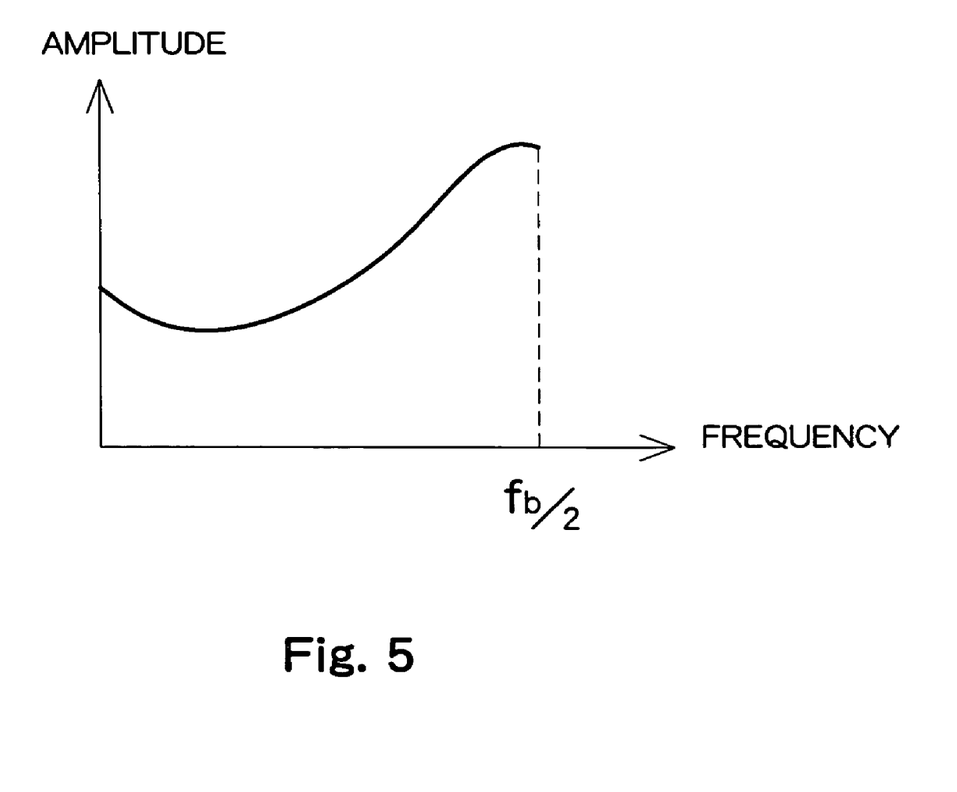
FIG. 5 is a diagram showing characteristic of the fixed FIR filter shown in FIG. 1.

The fixed FIR filter 16 compensates for deterioration in a high region component of the digital signal sent from the interpolator 14 by boosting its high region component. That is, as the high region component of the original signal has been deteriorated while passing through the reproduction head 2 and the filters of the analogue filter 10 and the interpolator 14, the high region component is boosted by a predetermined amount (a fixed value) for compensation. FIG. 5 shows a filtering characteristic of the fixed FIR filter 16. The illustrated characteristic is the result of boosting a frequency gain near the fb/2 utilizing a coefficient set to each of the coefficient units of the fixed FIR filter 16. The digital signal having a high region compensated for by the fixed FIR filter 16 is supplied to a variable BPF 18.

The variable BPF 18 allows only a predetermined frequency component to pass, and the predetermined frequency component to pass is desirably adjustable. The variable BPF 18 comprises a combination of a plurality of latches and coefficient units with variable coefficients for multiplication by the coefficient units.

Figure 6:
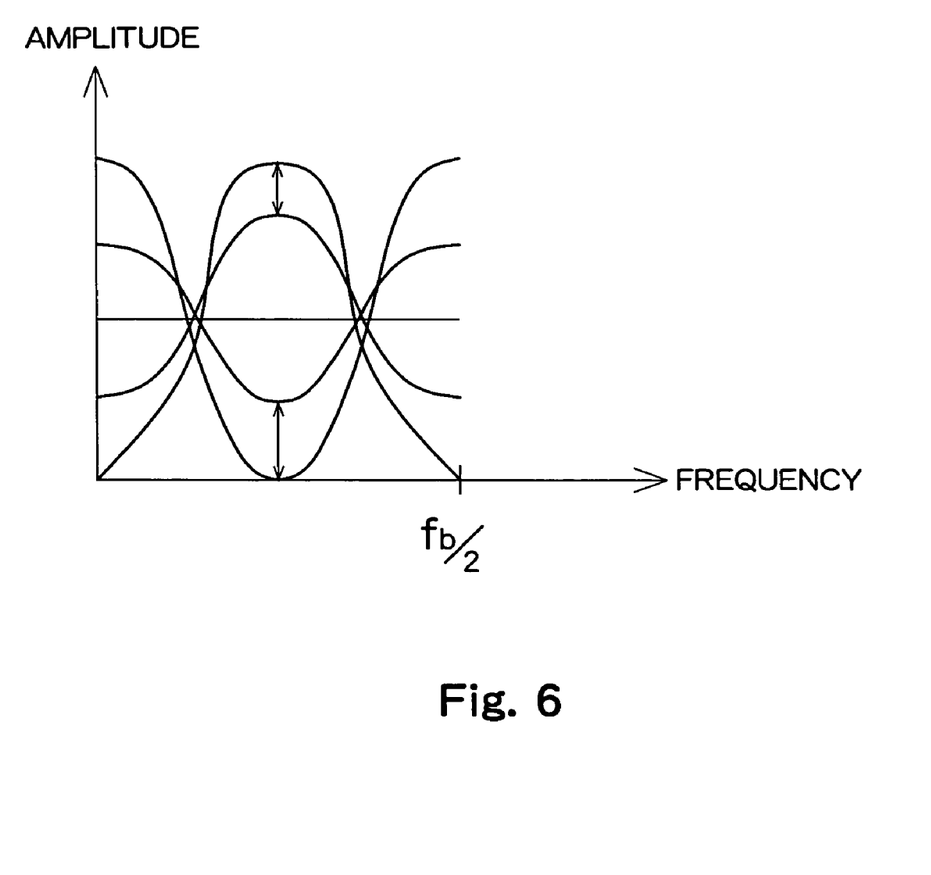
FIG. 6 is a diagram for explaining characteristic of the variable BPF shown in FIG. 1.
Figure 7:
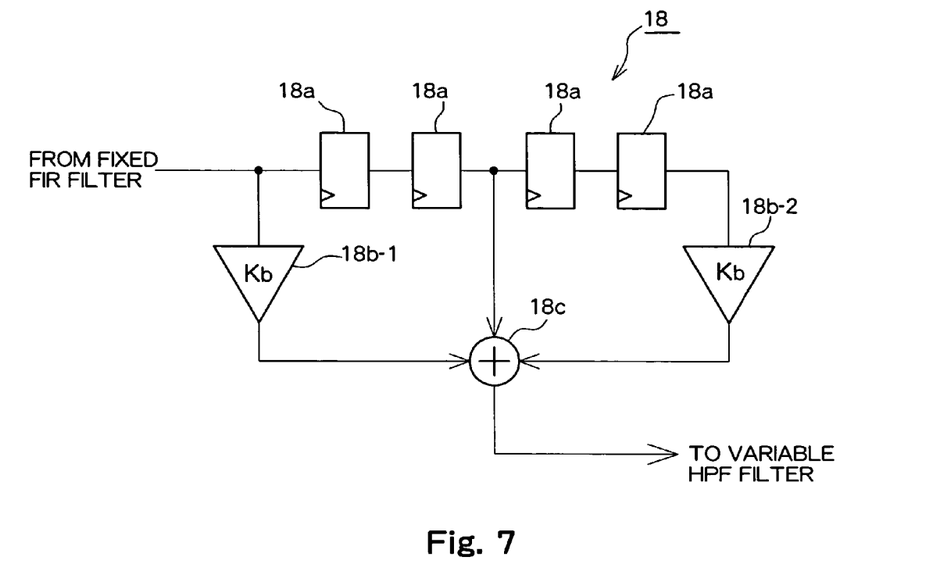
FIG. 7 is a diagram showing a structure of the variable BPF shown in FIG. 1.

FIG. 6 shows a filtering characteristic of the variable BPF 18. FIG. 7 shows a structure of the variable BPF 18. Specifically, the variable BPF 18 comprises a plurality of (four in the drawing) serially connected latches 18a, a plurality of (two in the drawing) parallel connected coefficient units 18b-1 and 18b-2, and an adder 18c. An output from the fixed FIR filter 16 is supplied to the latch 18a and the coefficient unit 18b-1. The coefficient unit 18b-1 multiplies the digital signal by a variable coefficient Kb and outputs the result to the adder 18c. The latch 18a holds the digital signal, and then outputs to the adder 18c. A digital signal having passed through the plurality of latches 18a is supplied to the coefficient unit 18b-2, which then multiplies the input digital signal by a variable coefficient Kb before outputting the signal to the adder 18c. The adder 18c adds the supplied signals and outputs the result to the subsequent variable HPF 20.

The characteristics of the BPF filter varies as shown in FIG. 6, in which the arrows represent variation of the filtering characteristic, when the variable coefficients Kb of the coefficient units 18b-1 and 18b-2 are desirably changed. A variable coefficient Kb for changing the filtering characteristic of the variable BPF 18 can be desirably set in response to an externally supplied adjustment signal.

The variable HPF 20 passes only a high region component, in which the amplitude of a signal is desirably adjustable. The variable HPF 20 as well comprises combination of a plurality of latches and coefficient units with variable coefficients for multiplication by the coefficient units.

Figure 8:
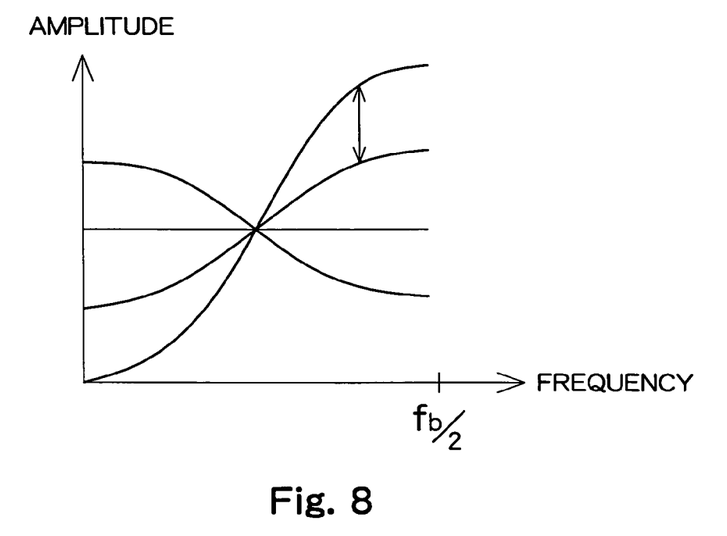
FIG. 8 is a diagram for explaining characteristic of the variable HPF shown in FIG. 1.
Figure 9:
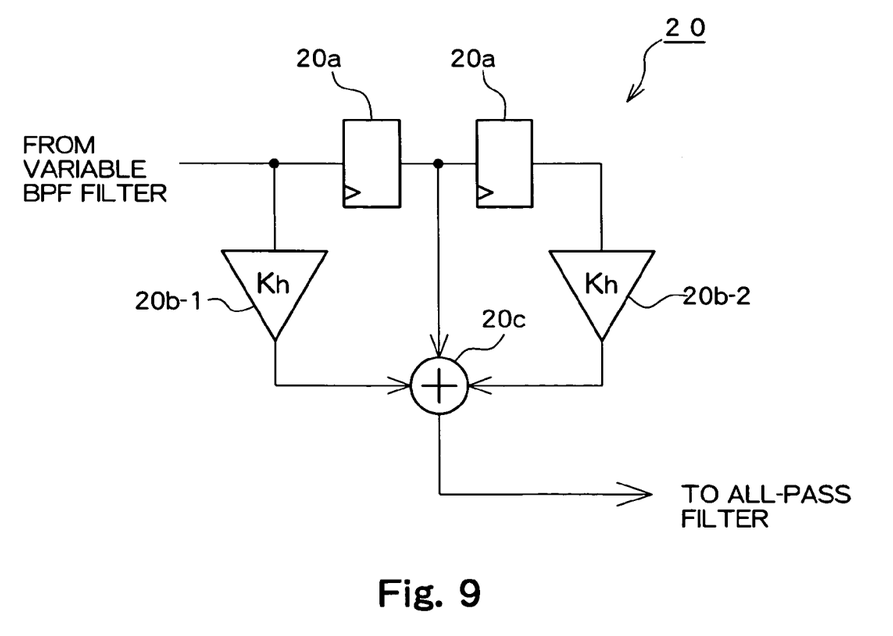
FIG. 9 is a diagram showing a structure of the variable HPF shown in FIG. 1.

FIG. 8 shows filtering characteristics of the variable HPF 20. FIG. 9 shows a structure of the variable HPF 20. Specifically, the variable HPF 20 comprises a plurality of (two in the drawing) latches 20a, a plurality of (two in the drawing) coefficient units 20b-1 and 20b-2, and an adder 20c. The digital signal from the variable BPF 18 is supplied to the latch 20a and the coefficient unit 20b-1. The coefficient unit 20b-1 multiplies the digital signal by a variable coefficient Kh and outputs the result to the adder 20c. The latch 20a holds the digital signal, and then outputs to the adder 20c. The digital signal having passed through the two latches 20a is supplied to the coefficient unit 20b-2, which then multiplies the input digital signal by a variable coefficient Kh before outputting to the adder 20c. The adder 20c adds these signals and outputs the result to the subsequent all-pass filter 22.

The characteristic of the HPF filter varies as shown in FIG. 8, in which the arrows represent variation of the filtering characteristic, when the variable coefficients Kh of the coefficient units 20b-1 and 20b-2 are desirably changed. The variable coefficient Kh for changing the filtering characteristic of the variable HPF 20 can be desirably set in response to an externally supplied adjustment signal, similar to the variable coefficient Kb of the variable BPF 18.

The above-described fixed FIR filter 16, variable BPF 18, and variable HPF 20 adjust mainly the amplitude of a digital signal.

Figure 10:
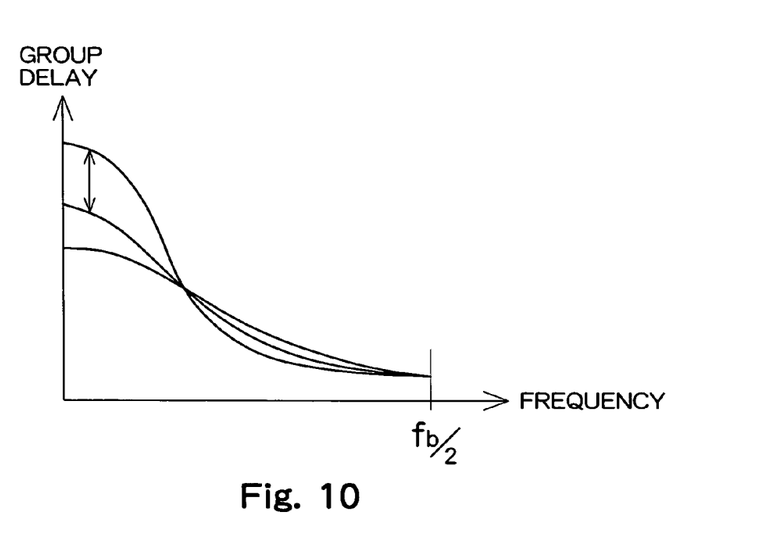
FIG. 10 is a diagram for explaining characteristic of the all-pass filter shown in FIG. 1.
Figure 11:
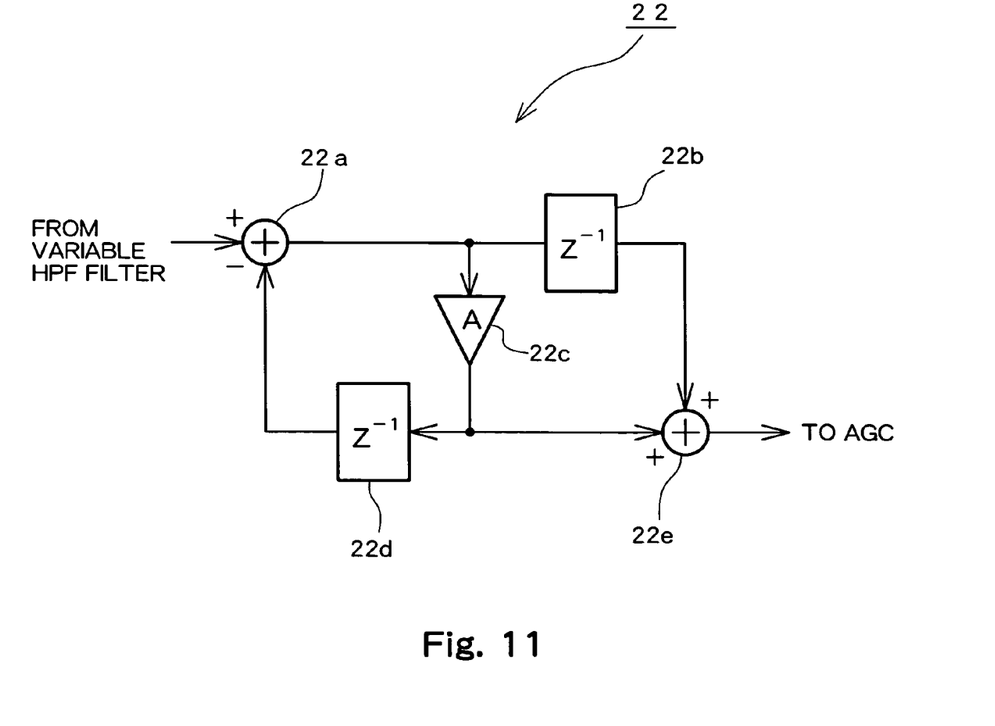
FIG. 11 is a diagram showing a structure of the all-pass filter shown in FIG. 1.

Meanwhile, mainly a group delay of a digital signal is adjusted by the all-pass filter 22. FIG. 10 shows a filtering characteristic of the all-pass filter 22. FIG. 11 shows a structure of the all-pass filter 22. Specifically, the all-pass filter 22 comprises a subtactor 22a, delayers 22b and 22d, a coefficient unit 22c, and an adder 22e. The digital signal from the variable BPF 20 is supplied to a subtactor 22a. The subtractor 22a obtains a difference between an input digital signal and a delayed digital signal from the delayer 22b, and outputs the difference to the coefficient units 22c and the delayer 22b. The coefficient unit 22c multiplies the differential signal by a variable coefficient A and outputs the result to the adder 22e and the delayer 22d. The delayer 22d delays the differential signal by an extent corresponding to one sample before supplying to the subtractor 22a. The adder 22e adds the signal from the delayer 22b and the signal from the coefficient unit 22c to output.

The subtractor 22a, the coefficient unit 22c, and the delayer 22d together constitute an IIR filter, while the coefficient unit 22c, the delayer 22b, and the adder 22e together constitute an FIR filter. The coefficient A of the coefficient unit 22c is adjusted to control a group delay of the signal. Specifically, when a negative coefficient A is set for the coefficient unit 22c, the amount of a group delay of a low region component of an input digital signal increases. When the value of the coefficient A is increased or decreased, the amount of the delay can be changed, as indicated by the arrow in the drawing. The variable coefficient A of the all-pass filter 22 is also desirably set according to an externally supplied adjustment signal. With this arrangement, a group delay of the digital signal can be compensated for and, consequently, substantially flat characteristic can be obtained.

The digital signal having the amplitude and group delay which have been compensated for by the fixed FIR filter 16, the variable BPF 18, the variable HPF 20, and the all-pass filter 22, is supplied to the AGC 24 and further to the subsequent variable FIR filter 26.

The AGC 24 adjusts, to some extent, the amplitude of the input digital signal before supplying to the variable FIR filter 26, so that amplitude divergence as might otherwise have occurred in the variable FIR filter 26 is suppressed. For this purpose, an output from the variable FIR filter 26 is monitored by a gain error detector 30, and an output from the loop filter 32 is fed back to the AGC 24, whereby the gain of the input digital signal is adjusted in a fed-back manner.

The variable FIR filter 26 is an FIR filter for modifying the characteristic of the input digital signal so as to coincide with the target characteristic, and having variable coefficients for its coefficient units. The variable coefficient is adjustably set in response to an adjustment signal from the adaptation controller 28. The adaptation controller 28 obtains a difference between the target characteristic (temporally determined target characteristic) and the characteristic of the input digital signal, and increases or decreases, to thereby adjust, the coefficients of the FIR filter based on the difference according to a predetermined algorithm.

Figure 12:
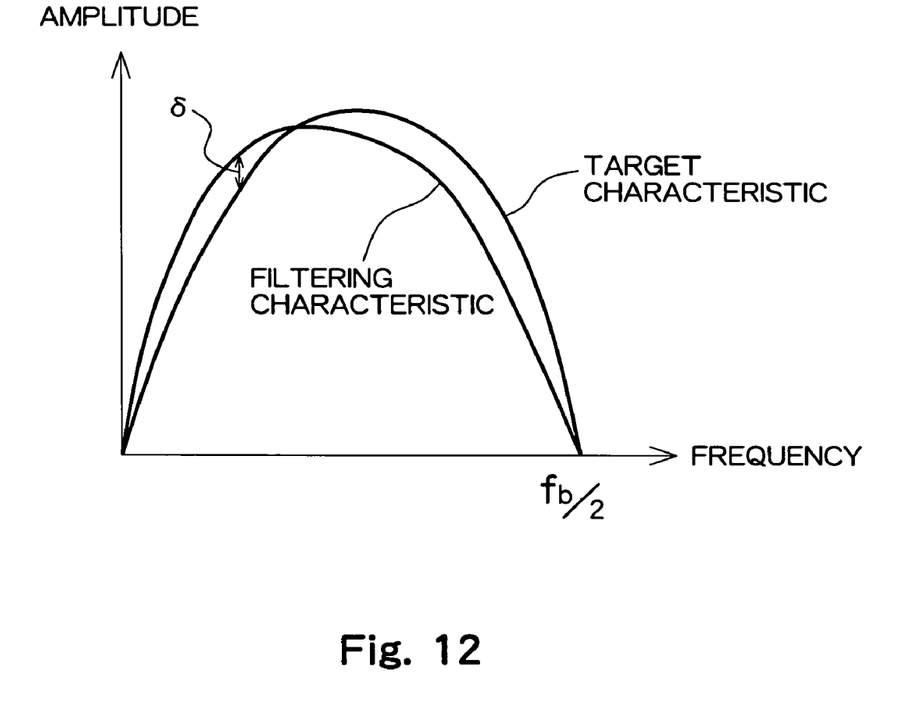
FIG. 12 is a diagram for explaining a difference in characteristic of a digital signal having passed through the respective filters and the target PR4 characteristic.

FIG. 12 shows the target characteristic to be obtained and the characteristic of an input digital signal, on which is imposed the characteristics of the reproduction head 2, the analogue filter 10, the interpolator 14, the fixed FIR filter 16, the variable BPF 18, the variable HPF 20, and the all-pass filter 22. The variable FIR filter 26 and the adaptation controller 28 adjust the coefficients of their coefficient units such that the difference (between these characteristics is eliminated.

Figure 13:
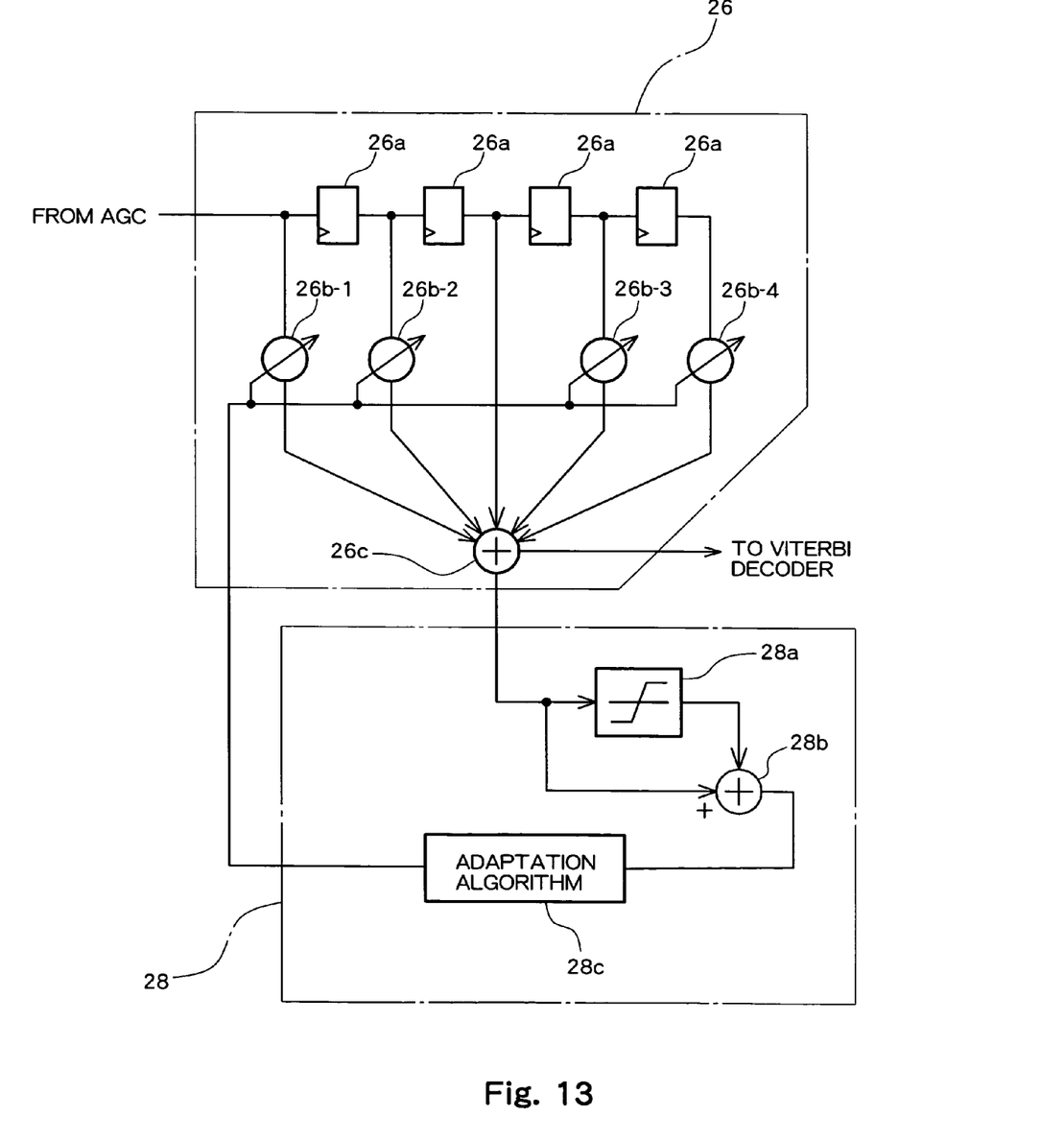
FIG. 13 is a diagram showing a structure of the variable FIR filter and the adaptation controller shown in FIG. 1.

The variable FIR filter 26 and the adaptation controller 28 have a structure shown in FIG. 13. Specifically, the variable FIR filter 26 comprises a plurality of (four in the drawing) serially connected latches 26a, a plurality of (four in the drawing) parallel connected variable coefficient units 26b-1 to 26b-4, and an adder 26c. The adaptation controller 28 comprises a judgment device 28a, a subtractor 28b, and an adaptation algorithm processor 28c.

Each of the coefficient units 26b-1 to 26b-4 of the variable FIR filter 26 multiplies an input digital signal by an adjusted coefficient and outputs the result to the adder 26c. The adder 26c outputs the addition result to the subsequent Viterbi decoder 42, as well as the judgment device 28a and the subtractor 28b of the adaptation controller 28. The coefficients of the coefficient units 26b-1 to 26b-4 are each initially set at a certain value in response to an externally supplied adjustment signal, and thereafter increased or decreased, to be thereby adjusted, to be at an appropriate value in response to an adjustment signal from the adaptation algorithm processor 28c.

The judgment device 28a compares the output from the adder 26c with a threshold value to determine which of the predetermined digital values the output digital value from the adder 26 is regarded as. That is, supposing that the predetermined digital values are 0, −1, and +1, the digital value from the adder 26c is compared with a threshold value to see which of the predetermined digital values the digital value from the adder 26c is regarded as. For example, suppose that an output digital value from the adder 26c is 0.8, the judgment device 28a determines that this value is regarded as +1, and outputs the result to the subtractor 28b.

The subtractor 28b executes subtraction using the output from the adder 26c and the judgment result from the judgment device 28a to obtain their difference. This difference corresponds to a difference δ between the input digital signal characteristic and the target characteristic. The subtractor 28b outputs the difference to the adaptation algorithm processor 28c.

The adaptation algorithm processor 28c changes, from time to time, the coefficients of the coefficient units 26b-1 to 26b-4 according to the LMS (Least Mean Square) algorithm, that is, such that the second power of the difference (an error signal) is minimized.

It should be noted that, while the adaptation algorithm processor 28c is formed using a circuit in the above, DSP may be programmed, instead, for software processing.

As described above, it is possible to converge an input digital signal at a high speed so as to exhibit the target characteristic (target PR4 characteristic).

It should be noted that, while the variable coefficient of the variable FIR filter 26 is adjusted in a feed-back manner using the adaptation controller 28 in the above example, the variable coefficient can alternatively be set directly at an increased or decreased value by setting a desired value to a register. In one example of the present embodiment, each of the coefficient units 26b-1 to 26b-4 of the variable FIR filter 26 is set at an initial value in response to an externally supplied adjustment signal (a signal from the register), as described above, and the coefficient value is then adjusted according to the adaptation algorithm.

The digital signal having been finally equalized by the variable FIR filter 26 is supplied to the Viterbi decoder 42. The Viterbi decoder 42 detects a digital signal according to the Viterbi algorithm, and outputs to the signal processing circuit 44. The signal processing circuit 44 obtains reproduced image and speech signals based on the digital signal obtained by the Viterbi decoder 42, and outputs these to the monitor and other devices.

Besides the Viterbi decoder 42, the variable FIR filter 26 additionally supplies an output to the gain error detector 30 and also to the timing error detector 34 and further, via the loop filter 36, to the NCO (Numerically Control Oscillator) 38. In the NCO 38, a control signal is created according to a timing error, which is then supplied to the interpolator 14 for use in timing adjustment. The interpolator 14 performs interpolation based on the control signal from the NCO 38, using a desired coefficient set according to a control signal, selected from the plurality of coefficient sets for the coefficient units 14b-1 to 14b-9, as shown in FIG. 4.

As described above, in the data reproduction device of this embodiment, a digital signal from the interpolator 14 is equalized by the digital equalizer 15, and the digital equalizer 15 is formed comprising variable filters, that is, filters having adjustable characteristics. With this arrangement, variation in characteristics of a magnetic tape or the like where digital data is recorded, in a reproduction head, and in the analogue filter 10 can be compensated for with a greater frequency and higher accuracy.

In addition, in this embodiment, the digital equalizer 15 is formed comprising the fixed FIR filter 16, the variable BPF 18, the variable HPF 20, the all-pass filter 22, and the variable FIR filter 26, and mainly the amplitude of a digital signal is adjusted by the fixed FIR filter 16, the variable BPF 18, and the variable HPF 20, while mainly its group delay is adjusted by the all-pass filter 22, before the digital signal is supplied to the variable FIR filter 26. Therefore, the digital signal which is supplied to the variable FIR filter 26 does have the characteristic which is already substantially close to the target characteristic. This helps to suppress possible divergence, as could be caused when an input digital signal having a characteristic which differs remarkably from the target characteristic is supplied to the variable FIR filter 26 and equalized so that the characteristic of the input digital signal is modified so as to coincide with the target characteristic. In particular, while group delay adjustment capability which can be realized by just the variable FIR filter 26 itself has the limits as the group delay adjustment applied using the variable FIR filter 26 to thereby modify the characteristic of the digital signal so as to coincide with the target characteristic undesirably affects the amplitude of the digital signal, highly accurate adjustment is achievable with this embodiment as the all-pass filter 22 does perform group delay adjustment to some extent, leaving only a group delay which cannot be compensated for by the all-pass filter 22 to be compensated for by the variable FIR filter 26.

In other words, in this embodiment, digital signal characteristic is roughly compensated for using the variable BPF 18, the variable HPF 20, and the all-pass filter 22, (and, additionally, the AGC 24,) and the remaining characteristic difference is finely compensated for using the variable FIR filter 26, whereby the digital signal is equalized such that its characteristic is modified so as to coincide with the target characteristic.

While an embodiment of the present invention has been described as above, it should be noted that the present invention is not limited to this embodiment, and that various modifications are applicable. Such modifications may include, for example, that the coefficients (a tap coefficient) of the coefficient units of the variable BPF 18, the variable HPF 20, the all-pass filter 22, and the variable FIR filter 26 may be set by writing a desired coefficient data value into the register so that the register supplies the coefficient data value to the respective coefficient units of the filter, instead of being changed in response to an externally supplied adjustment signal (that is, a signal designated by a user) to define the characteristics, as described above.

Further, it should be noted that it is not necessary to adjust all of the coefficients of the variable BPF 18, the variable HPF 20, the all-pass filter 22, and the variable FIR filter 26 and to thereby change their characteristics in this embodiment; it is sufficient that coefficients of only the variable HPF 20 and the all-pass filter 22, for example, be adjusted, while keeping the variable BPF 18 with its original characteristic. Still alternatively, the coefficient of either the variable BPF 18, the variable HPF 20, or the all-pass filter 22 alone may be adjusted.

Still further, the fixed FIR filter 16, which is used to boost, and thereby compensate for, a high region component which has been deteriorated while being processed in the reproduction head 2, the analogue filter 10, and the interpolator 14 in the above, may be omitted depending on the characteristic of the reproduction head 2 or the like.

The data reproduction device in this embodiment may be incorporated into a DVC (digital video camera), an HDD (hard disk drive), or a reproduction device of a CD and/or DVD drive, and applied to any device for reproducing digital data such as PR4 into an analogue signal using a reproduction head and digitizing the analogue reproduced signal.

What is claimed is:

1. A device for reproducing data, comprising:
   reproduction means for reproducing digital data;
   analogue-digital conversion means for converting an analogue signal sent from the reproduction means to a digital signal; and
   digital equalizing means for equalizing the digital signal sent from the analogue-digital conversion means so as to have a desired target characteristic,
   wherein the digital equalizing means has
      variable filtering means for adjusting an amplitude of the digital signal sent from the analogue-digital conversion means,
      variable group delay filtering means for adjusting a group delay of the digital signal sent from the variable filtering means, and
      variable FIR filtering means for compensating for a difference between characteristics of the digital signal sent from the variable group delay filtering means and the target characteristics,
   wherein the variable filtering means comprises
      fixed FIR filtering means for adjusting a high region amplitude of the digital signal sent from the digital-analogue conversion means,
      variable band-pass filtering means for adjusting a predetermined band amplitude of the digital signal sent from the fixed FIR filtering means, and
      variable high-pass filtering means for adjusting the high region amplitude of the digital signal sent from the variable band-pass filtering means.

2. The device according to claim 1, further comprising an interpolator for interpolating the digital signal sent from the analogue-digital conversion means and re-sampling the digital signal interpolated to output a resultant digital signal to the digital equalizing means.

3. The device according to claim 1, wherein each of the variable filtering means, the variable group delay filtering means, and the variable FIR filtering means has a plurality of latches serially connected to one another relative to an input digital signal, a plurality of coefficient units connected prior to, middle of, or subsequent to the plurality of latches, for multiplying the input digital signal by a coefficient to output a result, and an adder for adding outputs from the plurality of coefficient units, wherein the coefficient is variable so that the filtering characteristic is adjustable.

4. The device according to claim 3, further comprising a register for variably setting the coefficient wherein a coefficient data value is written into the register to thereby change the filtering characteristic.

5. The device according to claim 1, wherein the variable FIR filtering means comprises:
   a variable FIR filter having a variable coefficient unit for multiplying an input digital signal by a variable coefficient to output,
   a judgment device for judging which of ternary logic values an output from the variable FIR filter is regarded as;
   a subtractor for calculating a difference between an output from the variable FIR filter and an output from the judgment device; and
   an adaptation processor for adjusting the variable coefficient of the variable coefficient unit based on an output from the subtactor.

6. The device according to claim 1, wherein the variable filtering means and the variable group delay filtering means roughly compensate for a difference between characteristic of the digital signal and the target characteristic, and the variable HR filtering means finely compensates for a difference which is not compensated for by the variable filtering means and the variable group delay filtering means.

7. The device according to claim 1, wherein the digital data is digital data subjected to PR4 pre-coding.

* * * * *